United States Patent [19]

Shinohara

[11] 4,386,113
[45] May 31, 1983

[54] METHOD OF MAKING A MAGNETIC RECORDING MEDIUM

[75] Inventor: Koichi Shinohara, Kobe, Japan

[73] Assignee: Matsushita Electric Industrial Co., Ltd., Osaka, Japan

[21] Appl. No.: 268,151

[22] Filed: May 29, 1981

[30] Foreign Application Priority Data

May 29, 1980 [JP] Japan .................. 55-72304

[51] Int. Cl.³ .............................. B05D 3/06
[52] U.S. Cl. ...................... 427/42; 118/726; 219/121 EB; 219/121 EM; 219/420; 219/421; 427/128; 427/132

[58] Field of Search ............... 427/127–132, 427/48; 118/726; 219/420, 421, 121 EB, 121 EM

*Primary Examiner*—Bernard D. Pianalto
*Attorney, Agent, or Firm*—Wenderoth, Lind & Ponack

[57] ABSTRACT

A method of making a magnetic recording medium including a step of continuously depositing a ferromagnetic layer with the use of electron beam for heating an evaporation source material. A container for retaining said source material in a heating position is made of a ceramics having a composition comprising 97 to 99 wt % of MgO, 0.2 to 0.5 wt % of $Al_2O_3$ and 0.4 to 1 wt % of $SiO_2$.

3 Claims, 2 Drawing Figures

METHOD OF MAKING A MAGNETIC RECORDING MEDIUM

BACKGROUND OF THE INVENTION

This invention relates to a method of making a magnetic recording medium and more particularly relates to a method suitable for continuously depositing a ferromagnetic layer on a flexible substrate such as a plastic film.

Vacuum deposition, sputtering, ion plating, etc. have been known as a method of making a ferromagnetic thin film layer mainly composed of iron group metals. The method most practical for an industrial-scale manufacturing is vacuum deposition process employing an eletron beam for heating an evaporation source material. However the electron beam heating has not been fully developed yet because of its short history, and especially there scarcely exists an achievement in a continuous deposition.

When an evaporation source material is heated by electron beam, a temperature thereof becomes fairly high. It possibly causes a container for the source material to be melted, whereby it is destroyed in a short time or component materials thereof is included into deposited ferromagnetic layer, so as to deteriorate magnetic properties of the layer. Therefore what material the container is made of has been an important problem.

A water-cooled copper hearth has hitherto been used as the container having a heat resistance sufficient to be able to avoid the melting as mentioned above. However, in the process using the water-cooled copper hearth, the following disadvantage occurs:

In the early stage after being melted, the source material being in contact with the copper wall is cooled too much to be kept at the temperature above the melting point and so formes a deposit on the copper wall. This deposit is increased in the thickness with progress of the deposition process and reaches to a thickness at which the surface of the deposit is scarcely given the water cooling effect through the copper hearth wall. Then the surface of the deposit begins to be melted, so that the thickness thereof decreases gradually. This decrease progresses to an extent at which the melted material being in contact with the deposit surface is cooled sufficiently to be solidified to make the deposit. Thus the such increase and decrease of the deposit occurs cyclically, resulting in a cyclic variation of magnetic properties of the ferromagnetic layer deposited on the substrate.

SUMMARY OF THE INVENTION

It is an object of the invention to provide an improved method of continuously depositing a ferromagnetic layer on a flexible film in which the obtained layer has uniform magnetic properties.

To achieve the above-mentioned object, a method according to the invention is characterized by employing a ceramic container having a composition comprising 97 to 99 wt % of MgO and other oxide contents in which an amount of $Al_2O_3$ is below 0.5 wt % and that of $SiO_2$ is below 1 wt %, in place of the water-cooled copper hearth in the conventional method.

DETAILED DESCRIPTION OF THE INVENTION

Figure 1:
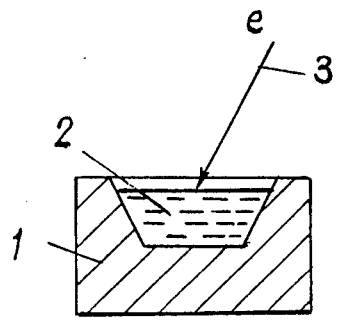
FIG. 1 is a sectional view of an evaporation source.

In order to search the optimum condition for depositing a ferromagnetic layer having satisfactory magnetic properties on a moving flexible film such as a plastic film, there were carried out experiments using various kinds of ceramic container 1 as shown in FIG. 1. An evaporation source material 2 was charged in the container 1 and bombarded by an electron beam 3 to be raised in temperature and evaporated. Conditions of the experiments were such that energy of an electron was 15 KeV to 60 Kev and supplied electric power was 10 kW to 140 kW. As the evaporation source material, Fe, Co, Ni alloys thereof and those including two or three additive elements were used.

As ceramics for the container BeO, $ZrO_2$, MgO, $Al_2O_3$, $Si_3N_4$, BN and spinel were examined.

As for the ceramics for the container, it was found to be essential to control contents of specified oxide materials other than principal component in order to obtain the container endurable to repeated use such as mentioned after, though a purity of a principal component is first to be controlled. And MgO ceramics is most suitable for the container. It should be composed mainly of 97% to 99% of MgO and further contents including less than 0.5%, preferably from 0.2% to 0.5%, of $Al_2O_3$ and less than 1%, preferably from 0.4% to 1%, of $SiO_2$.

When ceramics containing a principal component other than MgO is used, there are caused disadvantages such as a generation of cracks under a high temperature or a formation of a spinel film covering a surface of a melted source material. This spinel film is formed due to the activity of the source material such as Fe, Co or Ni, and, for example, it is composed of $CoZrO_3$, $CoAl_2O_4$, etc., when $ZrO_2$ or $Al_2O_3$ is used for the ceramics. By this spinel film an electron beam is defocused, whereby evaporation rate is made unstable, resulting in scattering of a coercive force of a deposited ferromagnetic layer.

The effect of limiting the content of $Al_2O_3$ is as follows:

If the content of $Al_2O_3$ is more than 0.5wt %, the spinel film as mentioned above is generated at about 1700° C. It is disadvantageous to a practical use because a temperature of the container reaches to about 1700° C. when the deposition is carried out at a rate of 1 μm/sec. If the content of $Al_2O_3$ is less than 0.2 wt %, microcracks are generated in the wall of the container at a high temperature. Into those microcracks are introduced the melted source material, which causes a fine variation of a temperature of the melted source material, causing a scattering of a coercive force of a deposited layer. Thus the content of $Al_2O_3$ should be less than 0.5 wt % and more preferably is from 0.2 to 0.5 wt %.

The effect of limiting the $SiO_2$ content is as follows:

If the content of $SiO_2$ is more than 1 wt %, microcracks are generated at a high temperature, and so there is caused a disadvantage such as described above in the case of the $Al_2O_3$ content less than 0.2 wt %. If the content of $SiO_2$ is less than 0.4 wt %, the ceramics of the container becomes slightly brittle. Thus the content of $SiO_2$ should be less than 1 wt % and more preferably is from 0.4 to 1 wt %.

Using the above-mentioned container, a ferromagnetic layer is deposited, for example, in the following manner:

In a vacuum chamber, a polyethylene terephthalate film is transported along a rotary metal drum with a diameter of 1 m which is kept at a room temperature. The chamber is kept in vacuum of $1 \times 10^{-5}$ Torr to $3 \times 10^{-5}$ Torr, or is introduced with oxygen gas to a pressure of $2 \times 10^{-5}$ Torr to $5 \times 10^{-5}$ Torr. A ferromagnetic layer is deposited on a portion of film located on the peripheral surface of the drum. An evaportion source material for making the ferromagnetic layer may be Co, an alloy comprising 70 wt % of Co and 30 wt % of Ni, 75 wt % of CO and 25 wt % of Ni, 80 wt % of Co and 20 wt % of Ni, or 90 wt % of Co and 10 wt % of Ni, Fe, an alloy comprising 80 wt % of Co and 20 wt % of Cr, or 80 wt % of Co and 15 wt % of Cr. The ferromagnetic layer is deposited to a thickness from 0.1 to 0.2 $\mu$m. Thus a magnetic recording medium having a coercive force from 600 Oe to 1200 Oe is obtained.

Figure 2:
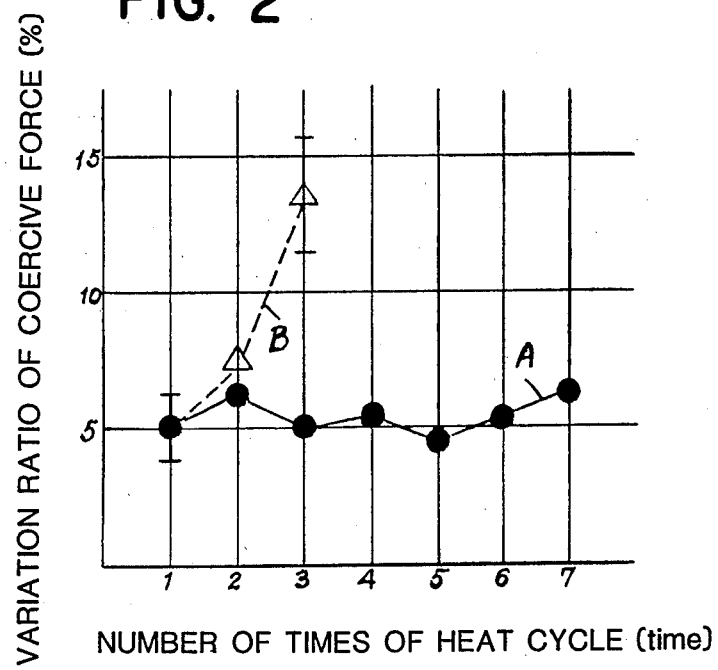
FIG. 2 is a graph showing relations between a number of times of heat cycle and variation ratio of coercive force of deposited layers according to a conventional method and the invention method.

FIG. 2 shows relations between a number of times of heat cycle given to the ceramic container by repeated use and a variation ratio of a coercive force of the deposited ferromagnetic layer. The relations are shown on cases of containers according to the present invention and that on the market, i.e. conventional article. The former case is denoted by a mark A and the latter by B. These data was obtained by performing depositions of Fe, Co, Ni, Fe-Ni alloy, Co-Ni alloy or Co-Fe alloy at deposition rates from 30 g/min to 500 g/min, with an amount of melted source material being from 5 kg to 30 kg on an average. And variation ratio is expressed by a value measured on the deposition length of 1000 m.

As seen from FIG. 2, the container according to the invention can provide with an uniform property of the deposited layer even after repeated use.

What is claimed is:

1. A method of making a magnetic recording medium including a step of continuously depositing a ferromagnetic layer with the use of electron beam for heating an evaporation source material, in which
   a container for retaining said source material in a heating position is made of a ceramics having a composition comprising 97 to 99 wt % of MgO, 0.2 to 0.5 wt % of $Al_2O_3$ and 0.4 to 1 wt % of $SiO_2$.

2. A method as claimed in claim 1, in which said ferromagnetic layer comprises Fe, Co, Ni or alloys thereof.

3. A ceramic crucible for retaining and evaporating a source material for composing a ferromagnetic deposition layer, having a composition comprising 97 to 99 wt % of MgO, 0.2 to 0.5 wt % of $Al_2O_3$ and 0.4 to 1 wt % of $SiO_2$.

* * * * *